United States Patent
Ruby et al.

(10) Patent No.: US 10,812,038 B2
(45) Date of Patent: Oct. 20, 2020

(54) ACOUSTIC WAVE RESONATOR

(71) Applicant: Avago Technologies International Sales Pte. Limited, Singapore (SG)

(72) Inventors: Richard C. Ruby, Menlo Park, CA (US); Stephen Roy Gilbert, San Francisco, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 267 days.

(21) Appl. No.: 15/720,131

(22) Filed: Sep. 29, 2017

(65) Prior Publication Data

US 2018/0034439 A1 Feb. 1, 2018

Related U.S. Application Data (63) Continuation-in-part of application No. 14/835,679, filed on Aug. 25, 2015, now Pat. No. 10,020,796, and a continuation-in-part of application No. 14/866,273, filed on Sep. 25, 2015, now Pat. No. 10,090,822, and a continuation-in-part of application No. 14/866,394, filed on Sep. 25, 2015, now Pat. No. 10,523,178.

(51) Int. Cl.
| | |
|---|---|
| H03H 9/02 | (2006.01) |
| H03H 9/64 | (2006.01) |
| H03H 9/145 | (2006.01) |
| H03H 9/25 | (2006.01) |
| H03H 3/10 | (2006.01) |

(52) U.S. Cl.
CPC .... *H03H 9/02834* (2013.01); *H03H 9/02574* (2013.01); *H03H 9/02866* (2013.01); *H03H 9/14544* (2013.01); *H03H 9/25* (2013.01); *H03H 9/6489* (2013.01); *H03H 3/10* (2013.01)

(58) Field of Classification Search
CPC .......... H03H 9/02574; H03H 9/02834; H03H 9/02866; H03H 9/14544; H03H 9/25; H03H 9/6489; H03H 3/10
USPC ........................ 333/133, 193–196; 310/313 B
See application file for complete search history.

(56) References Cited

U.S. PATENT DOCUMENTS

| | | | |
|---|---|---|---|
| 6,060,818 A | 5/2000 | Ruby et al. | |
| 7,105,980 B2 * | 9/2006 | Abbott | H03H 3/08 |
| | | | 310/313 A |
| 10,284,176 B1 * | 5/2019 | Solal | G10K 11/18 |
| 2005/0088257 A1 | 4/2005 | Ruby et al. | |

(Continued)

FOREIGN PATENT DOCUMENTS

| | | | |
|---|---|---|---|
| JP | 2001-053579 A | * | 2/2001 |
| JP | 2015-115870 A | * | 6/2015 |

OTHER PUBLICATIONS

English language machine translation of JP 2001-053579 A, published Feb. 23, 2001, 13 pages. (Year: 2001).*

(Continued)

*Primary Examiner* — Barbara Summons
(74) *Attorney, Agent, or Firm* — Foley & Lardner LLP (57) ABSTRACT

Temperature compensation of an acoustic stack is disclosed. A first temperature compensation layer is disposed between a first surface of a substrate and a second surface of a piezoelectric layer; and a second temperature compensation layer is disposed over the plurality of electrodes. A temperature coefficient of frequency (TCF) of the acoustic stack is approximately zero (0.0) over a frequency range of Band 13.

20 Claims, 4 Drawing Sheets

(56) References Cited

U.S. PATENT DOCUMENTS

| | | | |
|---|---|---|---|
| 2006/0103486 A1* | 5/2006 | Ruile | H03H 9/02834 333/133 |
| 2007/0132338 A1* | 6/2007 | Nakao | H03H 9/02559 310/313 A |
| 2007/0296306 A1* | 12/2007 | Hauser | H03H 3/10 310/313 R |
| 2008/0074212 A1* | 3/2008 | Matsuda | H03H 9/02559 333/195 |
| 2010/0327701 A1* | 12/2010 | Grannen | H03H 3/04 310/346 |
| 2013/0027153 A1* | 1/2013 | Shin | H03H 9/02102 333/133 |
| 2015/0069882 A1* | 3/2015 | Umeda | H03H 9/02574 310/313 B |
| 2015/0137660 A1* | 5/2015 | Hsu | H02N 1/002 310/309 |
| 2017/0033764 A1* | 2/2017 | Inoue | H03H 9/02574 |
| 2017/0063332 A1 | 3/2017 | Gilbert et al. | |
| 2017/0063339 A1 | 3/2017 | Burak et al. | |
| 2017/0085247 A1 | 3/2017 | Ruby et al. | |
| 2017/0222622 A1* | 8/2017 | Solal | H03H 3/08 |
| 2017/0250673 A1 | 8/2017 | Ruby et al. | |
| 2017/0279433 A1* | 9/2017 | Matsukura | H03H 9/14541 |
| 2018/0034440 A1* | 2/2018 | Ruby | H03H 9/02574 |

OTHER PUBLICATIONS

English language machine translation of JP 2015-115870 A, published Jun. 22, 2015, 24 pages. (Year: 2015).*

Co-pending U.S. Appl. No. 15/009,801, filed Jan. 28, 2016.

\* cited by examiner

ACOUSTIC WAVE RESONATOR

CROSS-REFERENCE TO RELATED APPLICATIONS

The present application is a continuation-in-part under 37 C.F.R. § 1.53(b) of, and claims priority under 35 U.S.C. § 120 from, commonly-owned U.S. patent application Ser. No. 14/835,679 filed on Aug. 25, 2015, naming Stephen Roy Gilbert, et al. as inventors. The present application is also a continuation-in-part under 37 C.F.R. § 1.53(b) of, and claims priority under 35 U.S.C. § 120 from, commonly-owned U.S. patent application Ser. No. 14/866,273 filed on Sep. 25, 2015, naming Stephen Roy Gilbert, et al. as inventors. The present application is also a continuation-in-part under 37 C.F.R. § 1.53(b) of, and claims priority under 35 U.S.C. § 120 from, commonly-owned U.S. patent application Ser. No. 14/866,394, naming Stephen Roy Gilbert, et al. as inventors. The entire disclosures of U.S. patent application Ser. Nos. 14/835,679; 14/866,394; and 14/866,273 are each specifically incorporated herein by reference.

BACKGROUND

Electrical resonators are widely incorporated in modern electronic devices. For example, in wireless communications devices, radio frequency (RF) and microwave frequency resonators are used in filters, such as filters having electrically connected series and shunt resonators forming ladder and lattice structures. The filters may be included in a duplexer (diplexer, triplexer, quadplexer, quintplexer, etc.) for example, connected between an antenna (there could be several antennas like for MIMO) and a transceiver for filtering received and transmitted signals.

Various types of filters use mechanical resonators, such as acoustic resonators. The resonators convert electrical signals to mechanical signals or vibrations, and/or mechanical signals or vibrations to electrical signals.

Resonators may be used as band-pass filters with associated passbands providing ranges of frequencies permitted to pass through the filters. The passbands of the resonator filters tend to shift in response to environmental and operational factors, such as changes in temperature and/or incident power. For example, the passband of a resonator filter moves lower in frequency in response to rising temperature and higher incident power.

Cellular phones, in particular, are negatively affected by shifts in passband due to fluctuations in temperature and power. For example, a cellular phone includes power amplifiers (PAs) that must be able to deal with larger than expected insertion losses at the edges of the filter (duplexer). As the filter passband shifts down in frequency, e.g., due to rising temperature, the point of maximum absorption of power in the filter, which is designed to be above the passband, moves down into the frequency range of the FCC or government designated passband. At this point, the filter begins to absorb more power from the PA and heats up, causing the temperature to increase further. Thus, the filter passband shifts down in frequency more, bringing the maximum filter absorbing point even closer. This sets up a potential runaway situation, which is avoided only by the fact that the reflected power becomes large and the filter eventually settles at some high temperature.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

The present teachings relate generally to temperature compensation of an acoustic stack. As used herein, in certain representative embodiments, an acoustic stack comprises: a substrate having a first surface and a second surface; a piezoelectric layer disposed over the substrate, the piezoelectric layer having a first surface, and a second surface, wherein the first surface of the substrate, or the second surface of the piezoelectric layer, comprises a plurality of features; a plurality of electrodes disposed over the first surface of the piezoelectric layer, the plurality of electrodes being configured to generate surface acoustic waves in the piezoelectric layer; a first temperature compensation layer disposed between the first surface of the substrate and the second surface of the piezoelectric layer; and a second temperature compensation layer disposed over the plurality of electrodes, wherein a temperature coefficient of frequency (TCF) of the acoustic stack is approximately zero (0.0) over a frequency range of Band 13.

Notably, the plurality of features described below in connection with representative embodiments are merely illustrative, and in other contemplated embodiments, these features are not provided in the acoustic stack. As such, the layers of the acoustic stack are comparatively smooth.

Furthermore, the acoustic stack may comprise more layers than those mentioned above, and described more fully below. By way of example, in certain embodiments, a silicon layer may be disposed between the temperature compensation layer and the piezoelectric layer. Further details of such an acoustic stack may be found in commonly owned U.S. patent application Ser. No. 15/009,801 filed on Jan. 28, 2016, naming Stephen Roy Gilbert, et al. as inventors. The entire disclosure of U.S. patent application Ser. No. 15/009, 801 is specifically incorporated herein by reference.

In accordance with a representative embodiment, a temperature coefficient of frequency (TCF) of the acoustic stack is less negative compared to an acoustic stack that does not comprise the temperature compensation layer.

In accordance with another representative embodiment, a temperature coefficient of frequency (TCF) of the acoustic stack is approximately zero (0.0) over a frequency range of Band 13. As will be appreciated by one of ordinary skill in the art, the downlink frequency range of Band 13 is 746 to 756 MHz; and the uplink frequency range is 777 MHz to 787 MHz, with middle frequencies of the downlink and uplink being equally spaced from the respective upper and lower ends of the respective downlink and uplink frequencies. Due to the existence of a Public Safety Band 2 MHz below the uplink passband, the thermal drift of the filter must be approximately zero.

Figure 1A:
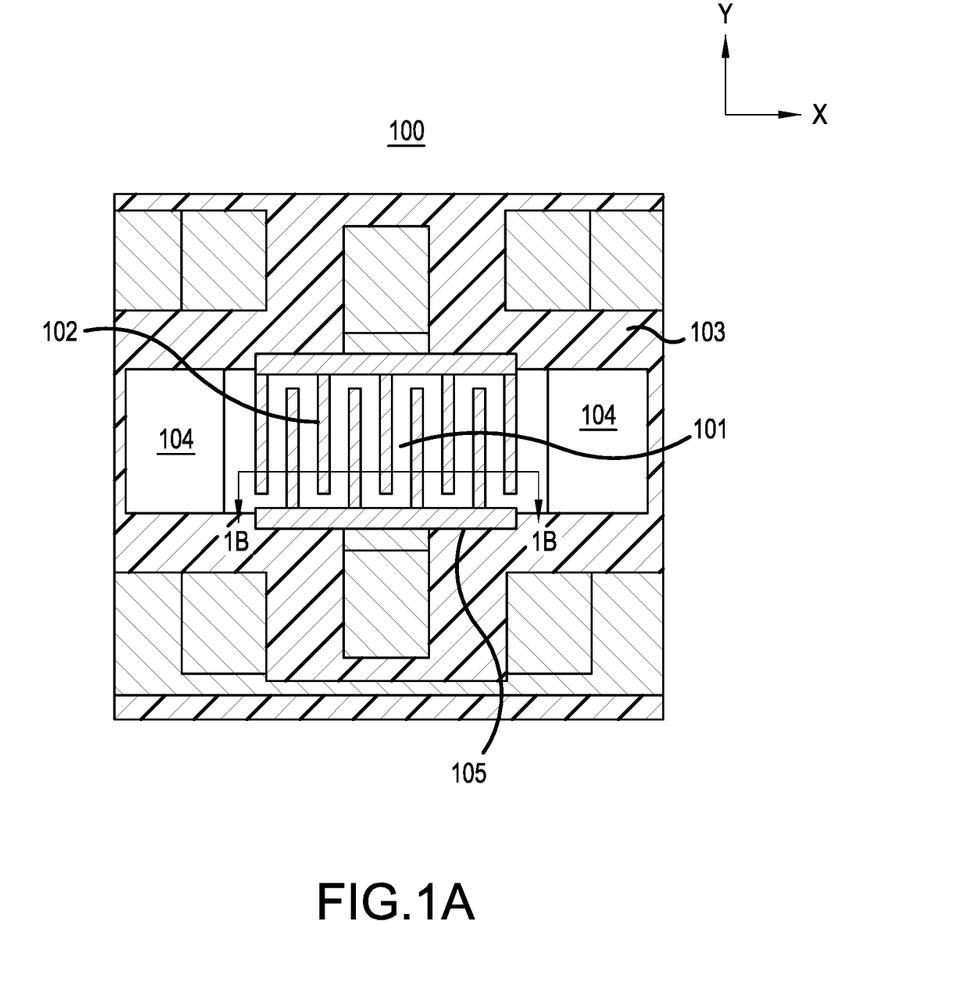
FIG. 1A is a top view of an acoustic resonator structure according to a representative embodiment.

FIG. 1A is a top view of a SAW resonator structure 100 according to a representative embodiment. Notably, the SAW resonator structure 100 is intended to be merely illustrative of the type of device that can benefit from the present teachings. Other types of SAW resonators, including, but not limited to dual mode SAW (DMS) resonators, and structures therefor, are contemplated by the present teachings. The SAW resonator structure 100 of the present teachings is contemplated for a variety of applications. By way of example, and as described in connection with FIG. 2, a plurality of SAW resonator structures 100 can be connected in a series/shunt arrangement to provide a ladder filter.

The SAW resonator structure 100 comprises a piezoelectric layer 103 disposed over a substrate (not shown in FIG. 1A). In accordance with representative embodiments, the piezoelectric layer 103 comprises one of lithium niobate (LiNbO$_3$), which is commonly abbreviated as LN; or lithium tantalate (LiTaO$_3$), which is commonly abbreviated as LT.

The SAW resonator structure 100 comprises an active region 101, which comprises a plurality of interdigitated electrodes 102 disposed over a piezoelectric layer 103, with acoustic reflectors 104 situated on either end of the active region 101. In the presently described representative embodiment, electrical connections are made to the SAW resonator structure 100 using bus bar structures 105.

As is known, the pitch of the resonator electrodes determines the resonance conditions, and therefore the operating frequency of the SAW resonator structure 100. Specifically, the interdigitated electrodes 102 are arranged with a certain pitch between them, and a surface wave is excited most strongly when its wavelength λ is the same as the pitch of the electrodes. The equation $f_0 = v/\lambda$ describes the relation between the resonance frequency ($f_0$), which is generally the operating frequency of the SAW resonator structure 100, and the propagation velocity (v) of a surface wave. These SAW waves comprise Rayleigh or Leaky waves, as is known to one of ordinary skill in the art, and form the basis of function of the SAW resonator structure 100.

Generally, there is a desired fundamental mode, which is typically a Leaky mode, for the SAW resonator structure 100. By way of example, if the piezoelectric layer 103 is a 42° rotated LT, the shear horizontal mode will have a displacement in the plane of the interdigitated electrodes 102 (the x-y plane of the coordinate system of FIG. 1A). The displacement of this fundamental mode is substantially restricted to near the upper surface (first surface 110 as depicted in FIG. 1C) of the piezoelectric layer 103. It is emphasized that the 42° rotated LT piezoelectric layer 103, and the shear horizontal mode are merely illustrative of the piezoelectric layer 103 and desired fundamental mode, and other materials and desired fundamental modes are contemplated.

Figure 1B:
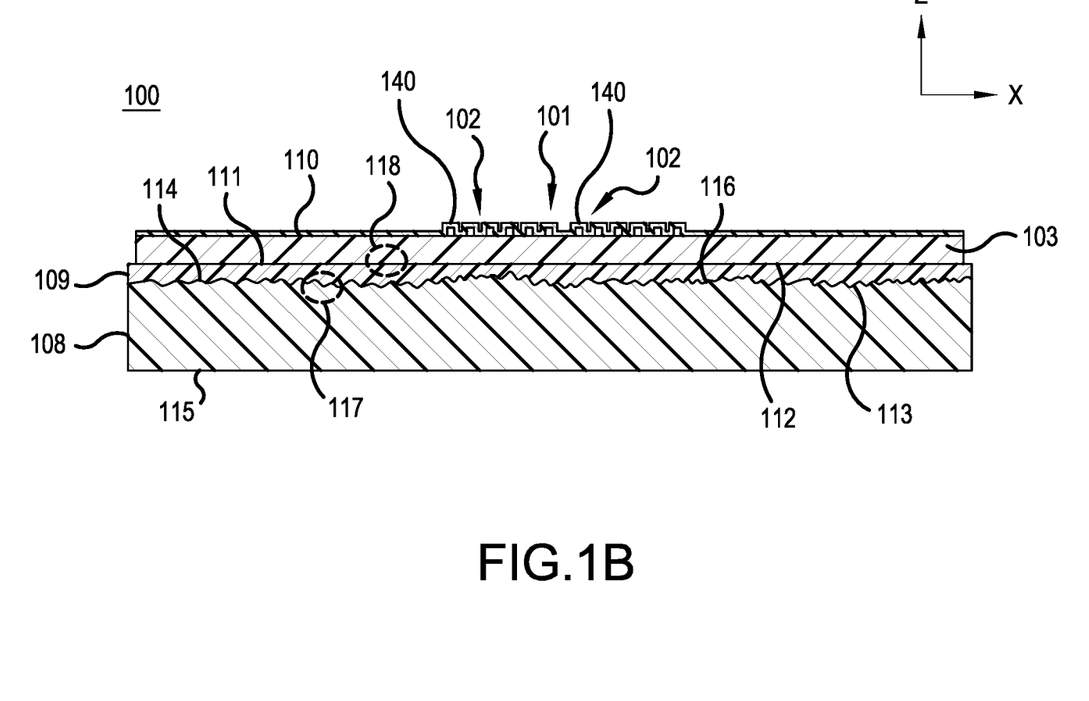
FIG. 1B is the cross-sectional view of the acoustic resonator structure of FIG. 1A along line 1B-1B.

FIG. 1B is a cross-sectional view of the SAW resonator structure 100 depicted in FIG. 1A along the lines 1B-1B. The SAW resonator structure 100 comprises a substrate 108 disposed beneath the piezoelectric layer 103, and a first temperature compensation layer 109 disposed between the substrate 108 and the piezoelectric layer 103.

As noted above, the piezoelectric layer 103 illustratively comprises one of LN or LT. Generally, in the representative embodiments described below, the piezoelectric layer 103 is a wafer that is previously fabricated, and that is adhered to the first temperature compensation layer 109 by atomic bonding as described more fully below.

As will become clearer as the present description continues, the temperature compensation provided to the SAW resonator structures of the present teachings results in three ways.

First, because of its thermal coefficient of expansion (TCE), the piezoelectric layer 103 (illustratively LT) tends to soften when heated rather rapidly compared to the substrate 108. This softening impacts the acoustic velocity, and thus the frequency of acoustic waves in the piezoelectric layer 103. However, as described more fully below, the piezoelectric layer 103 is comparatively thin. Moreover, because the piezoelectric layer 103 is atomically bonded to the substrate 108, its propensity to soften when heated is reduced because of the comparatively low TCE of the substrate 108, which is illustratively silicon. As such, the piezoelectric layer 103 is substantially mechanically "locked" to the substrate 108. Stated somewhat differently, some temperature compensation results from the relative stiffness and inflexibility to change dimensions (due to the low TCE) of the substrate 108. This forces the piezoelectric layer 103 to not expand or contract as rapidly with temperature compared to the same piezoelectric layer not disposed on the substrate 108. Beneficially, the locking of the piezoelectric layer 103 provides an effective TCF of the piezoelectric layer 103 in the range of approximately −12 ppm/° C. to approximately −25 ppm/° C.

Second, the thickness of the piezoelectric layer 103 is selected to be comparatively thin, allowing for greater thermal compensation by the first temperature compensation layer 109. To this end, the thicknesses (z-direction in the coordinate system of FIG. 1B) of the piezoelectric layer 103 and of the first temperature compensation layer 109 are selected not only to realize electrical performance characteristics, but also to improve the overall temperature coefficient of frequency (TCF) of the acoustic stack. As will be appreciated by one of ordinary skill in the art, since the acoustic waves are surface acoustic waves, they generally do not extend too deep (i.e., z-direction) beneath the upper surface of the piezoelectric layer 103. However, the thinner the piezoelectric layer is, the greater the likelihood of the interaction of the acoustic modes with the underlying layer(s). As such, the thicker the piezoelectric layer 103, the less impact the underlying layer(s) have on its acoustic characteristics. However, the thicker the piezoelectric layer 103, which has a negative TCF, the more deleterious is its impact on thermally-induced frequency. By way of example, LT has a TCF of −42 ppm/° C. Without compensation, over an allowed operating temperature range for a SAW resonator, this translates to approximately 4200 ppm, which is clearly unacceptable.

However, by the present teachings, the thickness of the piezoelectric layer 103 is selected to be comparatively thin, and the first temperature compensation layer 109 is selected to be comparatively thick in order to provide suitable TCF characteristics.

In accordance with a representative embodiment, the piezoelectric layer 103 has a thickness (z-direction in the coordinate system of FIG. 1B) in a range of approximately 2λ to approximately 4λ. In some representative embodiments, the piezoelectric layer 103 has a thickness in the range of approximately 2λ to approximately 5λ and in yet other representative embodiments, the thickness of the piezoelectric layer 103 is in the range of approximately 2λ to approximately 10λ. By way of illustration, in absolute numbers, the piezoelectric layer 103 has a thickness in a range of approximately 0.5 µm to approximately 50 µm.

Third, a second temperature compensation layer 140 is provided over the interdigitated electrodes 102. This second temperature compensation layer 140 aids the compensation provided by the first temperature compensation layer 109 to realize further improvement in the TCF of the SAW resonator structure 100. To this end, the comparatively low TCE of the substrate 108, which is illustratively silicon, 'locks' the piezoelectric layer 103, thus keeping the piezoelectric layer 103 from expanding with temperature. While it is desired to provide a TCF of 0 ppm/° C., with only the first temperature compensation layer 109, the TCF can be more negative than is desired for Band 13. However, by adding the second temperature compensation layer 140 over the interdigitated electrodes 102, the TCF can be improved to 0 ppm/° C. Notably, the second temperature compensation layer 140 has a higher relative permittivity than air, resulting in greater electric field strength (flux) existing in the second temperature compensation layer 140. Thus, the positive TCE of the second temperature compensation layer 140, and the pulling up (z-direction in the coordinate system of FIG. 1B) of the electric fields (and the accompanying acoustic waves) into the second temperature compensation layer 140 will further enhance the TCF of the acoustic stack.

In accordance with certain representative embodiments, the second temperature compensation layer 140 has a thickness in the range of approximately 250 Å to approximately 2000 Å. In other representative embodiments, the second temperature compensation layer 140 has a thickness in the range of approximately 250 Å to approximately 1.0 µm; and in still other representative embodiments the second temperature compensation layer 140 has a thickness in the range of approximately 250 Å to approximately 2.5 µm.

So, by the present teachings, the TCF of the acoustic stack can be reduced with benefits compared to known structures. Specifically, addition of a temperature compensation layer over the electrodes in known structures, which do not include a first temperature compensation layer, requires a comparatively thick layer (e.g., 1.5 µm) of temperature compensation material to attempt to address temperature-induced frequency drift. Addition of such a significant amount degrades the coupling coefficient ($kt^2$) to an unacceptable amount. By contrast, the addition of the comparatively thin second temperature compensation layer 140, while somewhat degrading of the $kt^2$ of the SAW resonator structure 100, is significantly less than known structures. Notably, some degradation of the $kt^2$ (coupling coefficient) from the deposition of second temperature compensation layer 140 over the interdigitated electrodes 102 will occur. But, there are now two ameliorating effects. First, Band 13 only needs a 1.3% BW (in contrast to 3% to 4% in most other bands). Thus, a lower $kt^2$ is tolerated. In fact, using the rule of thumb that the $kt^2$ must be 2× the desired BW, we only need a 2.6% $kt^2$. Second, the comparatively thin second temperature compensating layer 140 (illustratively $SiO_2$) has a thickness of approximately 0.2 µm of $SiO_2$, not 1.5 µm of SiO2. Hence, the effect of the second temperature compensation layer 140 on degrading $kt^2$ is less than occurs with known thicker temperature compensation layers disposed over the electrodes of a SAW device.

The first temperature compensation layer 109 is deposited by a known method, such as chemical vapor deposition (CVD) or plasma enhanced chemical vapor deposition (PECVD), or may be thermally grown. The first temperature compensation layer 109 is polished to a thickness (z-direction in the coordinate system of FIG. 1B) in the range of approximately 0.25λ to approximately 4λ, and in other embodiments the first temperature compensation layer 109 is polished to a thickness in the range of approximately 0.25λ to approximately 2λ. In absolute measure, in accordance with a representative embodiment, the first temperature compensation layer 109 has a thickness of approximately 0.5 µm to approximately 10.0 µm.

The second temperature compensation layer 140 is also deposited by a known method, such as chemical vapor deposition (CVD) or plasma enhanced chemical vapor deposition (PECVD), or may be thermally grown.

In accordance with a representative embodiment, the substrate 108 comprises crystalline silicon, which may be polycrystalline or monocrystalline, having a thickness of approximately 50 µm to approximately 800.0 µm. As will become clearer as the present description continues, the material selected for use as the substrate 108, among other considerations, is selected for ease of micromachining, using one or more of a variety of known techniques. Accordingly, other polycrystalline or monocrystalline materials besides silicon are contemplated for use as the substrate 108 of the SAW resonator structure 100. By way of example, these materials include, but are not limited to, glass, single crystal aluminum oxide ($Al_2O_3$) (sometimes referred to as "sapphire"), and polycrystalline $Al_2O_3$, to name a few. In certain representative embodiments, in order to improve the performance of a filter comprising SAW resonator structure(s) 100, the substrate 108 may comprise a comparatively high-resistivity material. Illustratively, the substrate 108 may comprise single crystal silicon that is doped to a comparatively high resistivity.

The first temperature compensation layer 109 is illustratively an oxide material, such as $SiO_2$, phosphosilicate glass (PSG), borosilicate glass (BSG), a thermally grown oxide, or other material amenable to polishing to a high degree of smoothness, as described more fully below. In accordance with a representative embodiment, the first temperature compensation layer 109 comprises BSG having a doping level of approximately 2.0 atomic percent (atm %) to approximately 3.0 atm %. In another representative embodiment, the first temperature compensation layer 109 has a doping level less than approximately 5.0 atomic percent (atm %).

The second temperature compensation layer 140 is illustratively an oxide material, such as $SiO_2$, phosphosilicate glass (PSG), borosilicate glass (BSG), a thermally grown oxide, or other material amenable to polishing to a high degree of smoothness, as described more fully below. In accordance with a representative embodiment, the second temperature compensation layer 140 comprises BSG having a doping level of approximately 2.0 atomic percent (atm %) to approximately 3.0 atm %. In another representative embodiment, the first temperature compensation layer 109 has a doping level less than approximately 5.0 atomic percent (atm %). In a representative embodiment, the second temperature compensation layer 140 has a thickness in the range of approximately 250 Å to approximately 2000 Å. In other representative embodiments, the second temperature compensation layer 140 has a thickness in the range of approximately 250 Å to approximately 1.0 µm; and in still other representative embodiments the second temperature compensation layer 140 has a thickness in the range of approximately 250 Å to approximately 2.5 µm.

Beneficially, as noted above providing the piezoelectric layer 103 with the noted thicknesses effectively locks the piezoelectric layer 103 to the substrate 108. The inclusion of the first temperature compensation layer 109 results in a TCF of the acoustic stack that is less negative compared to an acoustic stack that does not comprise the temperature compensation layers. Just by way of example, as noted above, the locking of the comparatively thin piezoelectric layer 103 of the representative embodiments results in it having a TCF that is approximately −12 ppm/° C. Providing the second temperature compensation layer 140 having a thickness (z-direction in the coordinate system of FIG. 1B) in the noted range, results in a TCF of the acoustic stack that is approximately zero (0.0) over a frequency range of Band 13. To this end, because the second temperature compensation layer 140 is disposed over the interdigitated electrodes 107, and thus near the upper surface of the piezoelectric layer 103 on which the interdigitated electrodes 107 are disposed, the second temperature compensation layer 140 is near the portion of the piezoelectric layer 103 where a significant portion of the acoustic motion occurs. This proximity of the second temperature compensation layer 140 to the upper surface of the piezoelectric layer 103 fosters a significantly beneficial impact on the TCF of the acoustic stack. It is emphasized that the TCF of the acoustic stack of the representative embodiment of FIG. 1B may be similarly nearly zero over other frequency ranges by selection of the piezoelectric layer 103, and the first and second temperature compensation layers 109, 140 of the materials noted above, having thicknesses in the noted range, may be realized.

The piezoelectric layer 103 has a first surface 110, and a second surface 111, which opposes the first surface 110. Similarly, the first temperature compensation layer 109 has a first surface 112 and a second surface 113. As depicted in FIG. 1B, the first surface 112 of the first temperature compensation layer 109 is atomically bonded to the second surface 111 of the piezoelectric layer 103, as described more fully below.

The substrate 108 has a first surface 114 and a second surface 115 opposing the first surface 114. The first surface 114 has a plurality of features 116 there-across. As noted above, undesired spurious modes are launched in the piezoelectric layer 103, and propagate down to the first surface 114. As described more fully in the above-incorporated applications, the plurality of features 116 reflect undesired spurious modes at various angles and over various distances to destructively interfere with the undesired spurious waves in the piezoelectric layer 103, and possibly enable a portion of these waves to be beneficially converted into desired SAW waves. Again as described more fully below, the reflections provided by the plurality of features 116 foster a reduction in the degree of spurious modes (i.e., standing waves), which are created by the reflection of acoustic waves at the interface of the second surface 111 of the piezoelectric layer 103 and the first surface 112 of first temperature compensation layer 109. Ultimately, the reflections provided by the plurality of features 116 serve to improve the performance of devices (e.g., filters) that comprise a plurality of SAW resonator structures 100.

As noted above, and as described more fully in the parent applications, the first surface 112 of first temperature compensation layer 109 is polished, such as by chemical-mechanical polishing in order to obtain a "mirror" like finish with a comparatively low root-mean-square (RMS) variation of height. This low RMS variation of height significantly improves the contact area between the first surface 112 of the first temperature compensation layer 109 and the second surface 111 of the piezoelectric layer 103 to improve the atomic bonding between the first surface 112 and the second surface 111. As is known, the bond strength realized by atomic bonding is directly proportional to the contact area between two surfaces. As such, improving the flatness/smoothness of the first surface 112 fosters an increase in the contact area, thereby improving the bond of the first temperature compensation layer 109 to the piezoelectric layer 103. As used herein, the term "atomically smooth" means sufficiently smooth to provide sufficient contact area to provide a sufficiently strong bond strength between the first temperature compensation layer 109 and the piezoelectric layer 103, at the interface of their first and second surfaces 112, 111, respectively.

As described in the parent applications, the shape, dimensions and spacing of the plurality of features 116 depends on their method of fabrication. For example, using a known etching technique, the plurality of features 116 are formed in the substrate 108, and may have a generally pyramidal shape. Notably, some of the plurality of features 116 may have comparatively "flat" tops. The plurality of features 116 also have a height that may be substantially the same across the width of the interface between the substrate 108 and the first temperature compensation layer 109. Moreover, the width (x-dimension in the coordinate system of FIG. 1C) of the plurality of features 116 may be the same, or may be different. Generally, however, the width of the features is on the order of the desired fundamental mode of the SAW resonator structure 100.

Alternatively, and again depending on the method of fabrication, the height of the plurality of features 116 may not be the same. Rather, by selecting the height of the plurality of features 116 to be different, a reduction in the incidence of more than one of the spurious modes can be realized.

The substrate 108 is illustratively single-crystal silicon, or other material having crystalline properties. The present teachings make use of the etching properties of the substrate 108 to realize the various characteristics of the plurality of features 116. In one representative embodiment, the plurality of features 116 are formed by etching the substrate 108 along crystalline planes. In this case, the plurality of features 116 having pyramidal shapes and sides that are on a "slant" foster reflections at off-angles relative to the incident direction of the acoustic waves.

As noted above, there are multiple spurious modes, each having a different frequency and wavelength. In accordance with a representative embodiment, the height of the plurality of features 116 of the substrate 108 is approximately one-fourth (¼) λ of one or more of the spurious modes. Selecting the height of the plurality of features 116 to be approximately one-fourth (¼) λ of a particular spurious mode alters the phase of the reflected waves, and results in destructive interference by the reflected waves, and substantially prevents the establishment of standing waves, and thus spurious modes.

In some embodiments, the height of the plurality of features 116 is substantially the same, and the height is selected to be approximately one-fourth (¼) λ of one (e.g., a predominant) of the spurious modes. In other embodiments, the height of the plurality of features 116 is not the same, but rather each different height is selected to be approximately equal to one-fourth (¼) λ of one of the multiple spurious modes. By selecting this one height or multiple heights, the phase of the reflected waves is altered, which results in destructive interference by the reflected waves, thereby substantially preventing the establishment of standing waves of multiple frequencies, thus preventing the establishment of multiple spurious modes.

By way of example, if the spurious modes have a frequency of 700 MHz, the wavelength λ is approximately 6.0 μm. As such, the height would be approximately 1.5 μm. By contrast, if the spurious modes have a frequency of 4200 MHz, the λ is approximately 1.0 μm. In this example, the height would be approximately 0.25 μm. More generally, the height is in the range of less than approximately 0.25 μm (e.g., 0.1 μm) to greater than approximately 1.5 μm (e.g., 2.5 μm). As will be appreciated, the range for the height depends on the frequency of the fundamental mode.

The non-periodic orientation of the plurality of features 116, the generally, angled surfaces (e.g., sides of the features 116) provided by the plurality of features 116, and providing the height of the plurality of features 116 to be in the noted range relative to the wavelength of the propagating spurious modes combine to alter the phase of the acoustic waves incident on the various features. Beneficially, these factors in combination result in comparatively diffuse reflection of the acoustic waves back through the first temperature compensation layer 109 and into the piezoelectric layer 103. This comparatively diffuse reflection of the acoustic waves from the plurality of features 116 will generally not foster constructive interference, and the establishment of resonance conditions. Accordingly, the plurality of features 116 generally prevent the above-noted parasitic acoustic standing waves (i.e., spurious modes) from being established from the acoustic waves generated in the piezoelectric layer 103, which travel down and into the substrate 108.

In other representative embodiments, the plurality of features 116 have random spacing, or random orientation, or random heights, or a combination thereof. As can be appreciated, such random spacings, orientations and heights, alone or in combination can foster comparatively diffuse reflection of the acoustic waves incident thereon. This diffuse reflection, in turn, alters the phase of the acoustic waves, and serves to reduce the propensity of standing waves (and thus spurious modes) from being established.

The random spacing, orientation, and heights of the plurality of features 116 can be effected by a number of methods. For example, the plurality of features 116 may be provided by simply using an unpolished wafer for the substrate 108. Alternatively, the second surface 115 of the substrate 108 could be rough polished by CMP, for example. While the plurality of features 116 of such an embodiment would likely not have the height relative to the wavelength of the spurious modes, the random nature of such an unpolished surface would likely provide a useful degree of diffusive reflection to avoid the establishment of a resonant condition for the spurious modes.

Unfortunately, at the atomic level the surfaces of such deposited films are atomically very rough. However, the first surface 112 of first temperature compensation layer 109 (e.g., PSG) can be polished by a known method to provide an atomically smooth surface. The surface of the first temperature compensation layer 109 is first planarized by polishing with aslurry, using a known CMP method. The remaining PSG can then be polished using a more refined slurry. Alternatively, a single more refined slurry can be used for both polishing steps if the additional polishing time is not objectionable. As noted above, the goal is to create a "mirror" like finish that is atomically smooth in order to foster strong atomic bonding between the first temperature compensation layer 109 and the piezoelectric layer 103, at the interface of their first and second surfaces 112, 111 respectively. Further details of the polishing sequence can be found, for example, in U.S. Pat. No. 6,060,818 and U.S. Patent Application Publication No. 20050088257, to Ruby, et al. The entire disclosures of U.S. Pat. No. 6,060,818, and U.S. Patent Application Publication No. 20050088257 are specifically incorporated herein by reference.

Such an atomically smooth surface can be realized by providing the first surface 112 of first temperature compensation layer 109 having an RMS variation in height of in the range of approximately 0.1 Å to approximately 10.0 Å; although beneficially, the RMS variation in height is less than approximately 5.0 Å.

As noted above, the forming of an atomically smooth first surface 112 provides an increased contact area at the interface of the first and second surfaces 112, 111, respectively, of the first temperature compensation layer 109 and the piezoelectric layer 103. This increased contact area, in turn, fosters a comparatively strong atomic bond between the first temperature compensation layer 109 and the piezoelectric layer 103. Among other benefits, the strong atomic bond between the first temperature compensation layer 109 and the piezoelectric layer 103 reduces separation or delamination of the first temperature compensation layer 109 and the piezoelectric layer 103, thereby increasing the reliability of devices comprising the SAW resonator structure 100 over time.

Figure 2:
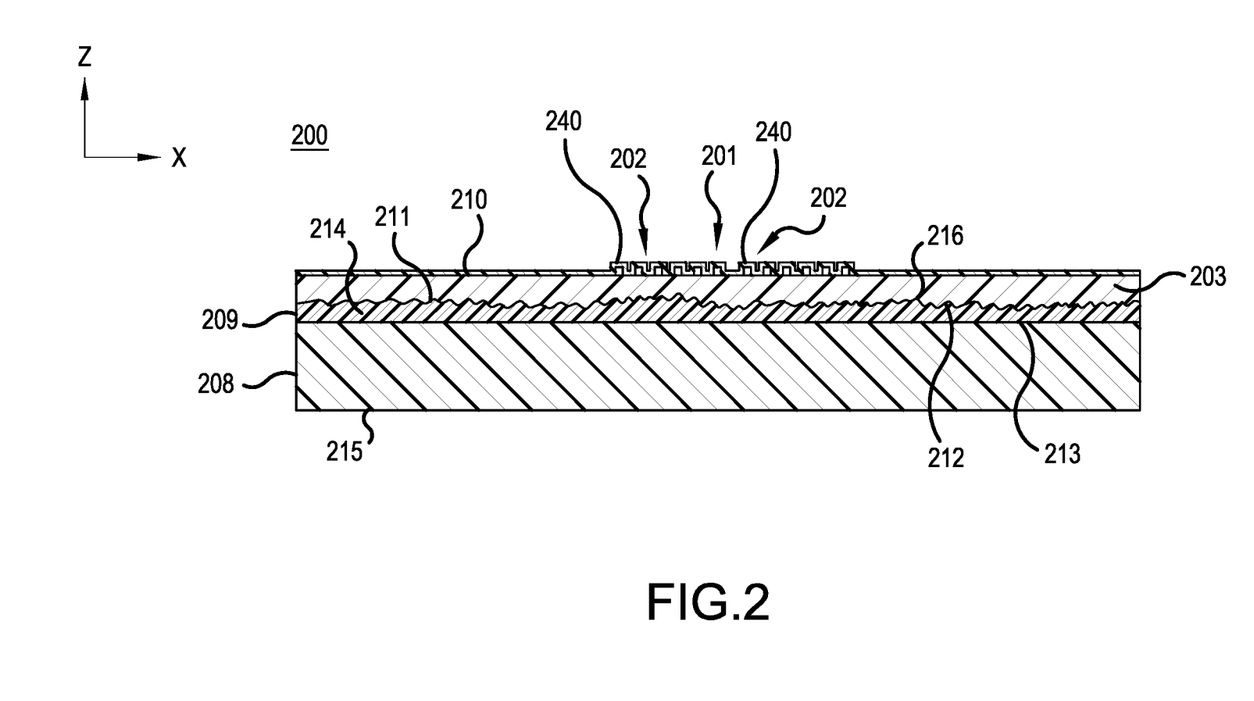
FIG. 2 is a cross-sectional view of an acoustic resonator structure according to a representative embodiment.

FIG. 2 is a cross-sectional view of the SAW resonator structure 200 in accordance with another representative embodiment. Many aspects and details of SAW resonator structure 200 are common to those of SAW resonator structure 100 described in connection with representative embodiments of FIGS. 1A-1B. Many of these aspects and details are not repeated, but nonetheless are relevant to the presently described representative embodiments.

The SAW resonator structure 200 comprises substrate 208 disposed beneath the piezoelectric layer 203, and first temperature compensation layer 209 disposed between the substrate 208 and the piezoelectric layer 203.

As noted above, the piezoelectric layer 203 illustratively comprises one of LN or LT. Generally, in the representative embodiments described below, the piezoelectric layer 203 is a wafer that is previously fabricated, and that is adhered to the first temperature compensation layer 209 by atomic bonding.

The materials selected for the piezoelectric layer 203 can be divided into two types: one which has been used for a long time and with a high degree of freedom in design is used for Rayleigh wave substrates; the other, with less freedom and limited in design, is for Leaky wave substrates with low loss characteristics, easily reaches the higher frequencies by high acoustic velocity, and is mainly used for mobile communications. LN and LT materials are often used for broadband filters, and according to the filter specifications the manufacturing materials and cutting angles differ. Filters for applications that require comparatively low loss generally require Leaky wave materials, while Rayleigh wave materials are predominately used for communication equipment that requires low ripple and low group delay characteristics. Among Rayleigh wave materials, ST-cut crystal has the best temperature characteristics as a piezoelectric material.

As described in connection with the representative embodiments of FIG. 1B, the temperature compensation provided to the SAW resonator structures of the present teachings result in two ways.

First, because of its thermal coefficient of expansion (TCE), the piezoelectric layer 203 (illustratively LT) tends to soften when heated rather rapidly compared to the substrate 208. This softening impacts the acoustic velocity, and thus the frequency of acoustic waves in the piezoelectric layer 203. However, as described more fully below, the piezoelectric layer 203 is comparatively thin. Moreover, because the piezoelectric layer 203 is atomically bonded to the substrate 208, its propensity to soften when heated is reduced because of the comparatively low TCE of the substrate 208, which is illustratively silicon. As such, the piezoelectric layer 203 is substantially mechanically "locked" to the substrate 208, and the effective TCF of the piezoelectric layer 203 is approximately −12 ppm/° C.

Second, the thickness of the piezoelectric layer 203 is selected to be comparatively thin, allowing for greater thermal compensation by the first temperature compensation layer 209. To this end, the thicknesses (z-direction in the coordinate system of FIG. 1B) of the piezoelectric layer 203 and of the first temperature compensation layer 209 are selected not only to realize electrical performance characteristics, but also to improve the overall temperature coefficient of frequency (TCF) of the acoustic stack. As will be appreciated by one of ordinary skill in the art, since the acoustic waves are surface acoustic waves, they generally do not extend too deep (i.e., z-direction) beneath the upper surface of the piezoelectric layer 203. However, the thinner the piezoelectric layer is, the greater the likelihood of the interaction of the acoustic modes with the underlying layer (s). As such, the thicker the piezoelectric layer 203, the less impact the underlying layer(s) have on its acoustic characteristics. However, the thicker the piezoelectric layer 203, which has a negative TCF, the more deleterious is its impact on thermally-induced frequency. By way of example, LT has a TCF of −42 ppm/° C. Without compensation, over an allowed operating temperature range for a SAW resonator, this translates to approximately 4200 ppm, which is clearly unacceptable.

However, by the present teachings, the thickness of the piezoelectric layer 203 is selected to be comparatively thin, and the first temperature compensation layer 209 is selected to be comparatively thick in order to provide suitable TCF characteristics.

In accordance with a representative embodiment, the piezoelectric layer 203 has a thickness (z-direction in the coordinate system of FIG. 1B) in a range of approximately 2λ to approximately 4λ. In some representative embodiments, the piezoelectric layer 203 has a thickness in the range of approximately 2λ to approximately 5λ, and in yet other representative embodiments, the thickness of the piezoelectric layer 203 is in the range of approximately 2λ to approximately 20λ. By way of illustration, in absolute numbers, the piezoelectric layer 203 has a thickness in a range of approximately 0.5 μm to approximately 3.0 μm.

Third, a second temperature compensation layer 240 is provided over the electrodes 202. This second temperature compensation layer 240 aids the compensation provided by the first temperature compensation layer 209 to realize further improvement in the TCF of the SAW resonator structure 200. To this end, the comparatively low TCE of the substrate 208, which is illustratively silicon, 'locks' the piezoelectric layer 203, thus keeping the piezoelectric layer 203 from expanding with temperature. While it is desired to provide a TCF of 0 ppm/° C., with only the first temperature compensation layer 209, the TCF can be more negative than is desired for Band 13. However, by adding the second temperature compensation layer 240 over the electrodes 202, the TCF can be improved to 0 ppm/° C. In accordance with representative embodiments, the second temperature compensation layer 240 has a thickness in the range of approximately 2000 Å to approximately 2 um.

So, by the present teachings, the TCF of the acoustic stack can be reduced with benefits compared to known structures. Specifically, addition of a temperature compensation layer over the electrodes in known structures, which do not include a first temperature compensation layer, requires a comparatively thick layer (e.g., 1.5 μm) of temperature compensation material to attempt to address temperature-induced frequency drift. Addition of such a significant amount of temperature compensation material over the electrodes in known structures degrades the coupling coefficient ($kt^2$) to an unacceptable amount. By contrast, in accordance with the present teachings, the addition of the comparatively thin second temperature compensation layer 240, while somewhat degrading of the $kt^2$ of the SAW resonator structure 200, is significantly less than known structures. Notably, some degradation of the $kt^2$ (coupling coefficient) from the deposition of second temperature compensation layer 240 over the interdigitated electrodes 102 will occur. But, there are now two ameliorating effects. First, Band 13 only needs a 1.3% BW (in contrast to 3% to 4% in most other bands). Thus, a lower $kt^2$ is tolerated. In fact, using the rule of thumb that the $kt^2$ must be 2× the desired BW, we only need a 2.6% $kt^2$. Second, the comparatively thin second temperature compensating layer 240 (illustratively SiO$_2$) has a thickness of approximately 0.2 µm of SiO$_2$, not 1.5 µm of SiO2. Hence, the effect of the second temperature compensation layer 240 on degrading kt$^2$ is less than occurs with known thicker temperature compensation layers disposed over the electrodes of a SAW device.

The first temperature compensation layer 209 is deposited by a known method, such as chemical vapor deposition (CVD) or plasma enhanced chemical vapor deposition (PECVD), or may be thermally grown. The first temperature compensation layer 209 is polished to a thickness (z-direction in the coordinate system of FIG. 1B) in the range of approximately 0.25λ, to approximately 4λ, and in other embodiments the first temperature compensation layer 209 is polished to a thickness in the range of approximately 0.25λ to approximately 2λ. In absolute measure, in accordance with a representative embodiment, the first temperature compensation layer 209 has a thickness of approximately 0.5 µm to approximately 10.0 µm.

The second temperature compensation layer 240 is also deposited by a known method, such as chemical vapor deposition (CVD) or plasma enhanced chemical vapor deposition (PECVD), or may be thermally grown.

The second temperature compensation layer 240 is illustratively an oxide material, such as SiO$_2$, phosphosilicate glass (PSG), borosilicate glass (BSG), a thermally grown oxide, or other material amenable to polishing to a high degree of smoothness, as described more fully below. In accordance with a representative embodiment, the second temperature compensation layer 240 comprises BSG having a doping level of approximately 2.0 atomic percent (atm %) to approximately 3.0 atm %. In another representative embodiment, the first temperature compensation layer 209 has a doping level less than approximately 5.0 atomic percent (atm %).

Beneficially, as noted above, providing the piezoelectric layer 203 with the noted thicknesses effectively locks the piezoelectric layer 203 to the substrate 208. The inclusion of the first temperature compensation layer 209 results in a TCF of the acoustic stack that is less negative compared to an acoustic stack that does not comprise the temperature compensation layer. Just by way of example, as noted above, the locking of the comparatively thin piezoelectric layer 203 of the representative embodiments results in it having a TCF that is approximately –12 ppm/° C. to approximately –25 ppm/° C. Providing the second temperature compensation layer 240 having a thickness (z-direction in the coordinate system of FIG. 1B) in the noted range, results in a TCF of the acoustic stack that is approximately zero (0.0) over a frequency range of Band 13. It is emphasized that the TCF of the acoustic stack of the representative embodiment of FIG. 1B may be similarly nearly zero over other frequency ranges by selection of the piezoelectric layer 203, and the first and second temperature compensation layers 209, 240 of the materials noted above, and having thicknesses in the noted range without undue experimentation.

In accordance with a representative embodiment, the substrate 208 comprises crystalline silicon, which may be polycrystalline or monocrystalline, having a thickness of approximately 100.0 µm to approximately 800.0 µm. As will become clearer as the present description continues, the material selected for use as the substrate 208, among other considerations, is selected for ease of micromachining, using one or more of a variety of known techniques. Accordingly, other polycrystalline or monocrystalline materials besides silicon are contemplated for use as the substrate 208 of the SAW resonator structure 200. By way of example, these materials include, but are not limited to, glass, single crystal aluminum oxide (Al$_2$O$_3$) (sometimes referred to as "sapphire"), and polycrystalline Al$_2$O$_3$, to name a few. In certain representative embodiments, in order to improve the performance of a filter comprising SAW resonator structure(s) 200, the substrate 208 may comprise a comparatively high-resistivity material. Illustratively, the substrate 208 may comprise single crystal silicon that is doped to a comparatively high resistivity.

The first temperature compensation layer 209 is illustratively an oxide material, such as SiO$_2$, phosphosilicate glass (PSG), borosilicate glass (BSG), a thermally grown oxide, or other material amenable to polishing to a high degree of smoothness, as described more fully below. In accordance with a representative embodiment, the first temperature compensation layer 209 comprises BSG having a doping level of approximately 2.0 atomic percent (atm %) to approximately 3.0 atm %. In another representative embodiment, the first temperature compensation layer 209 has a doping level less than approximately 5.0 atomic percent (atm %).

Beneficially, providing the piezoelectric layer 203 with the noted thicknesses effectively locks the piezoelectric layer 203 to the substrate 208. The inclusion of the first temperature compensation layer 209 results in a TCF of the acoustic stack that is less negative compared to an acoustic stack that does not comprise the temperature compensation layer. Just by way of example, as noted above, the locking of the comparatively thin piezoelectric layer 203 of the representative embodiments results in it having a TCF that is approximately –20 ppm/° C. Providing the first temperature compensation layer 209 of one of the noted materials, and having a thickness (z-direction in the coordinate system of FIG. 1B) in the noted range, results in a TCF of the acoustic stack that is approximately zero (0.0) over a frequency range of Band 13. It is emphasized that the TCF of the acoustic stack of the representative embodiment of FIG. 1B may be similarly nearly zero over other frequency ranges by selection of the piezoelectric layer 203 and the first temperature compensation layer 209 of the materials noted above, and having thicknesses in the noted range without undue experimentation.

Figure 3:
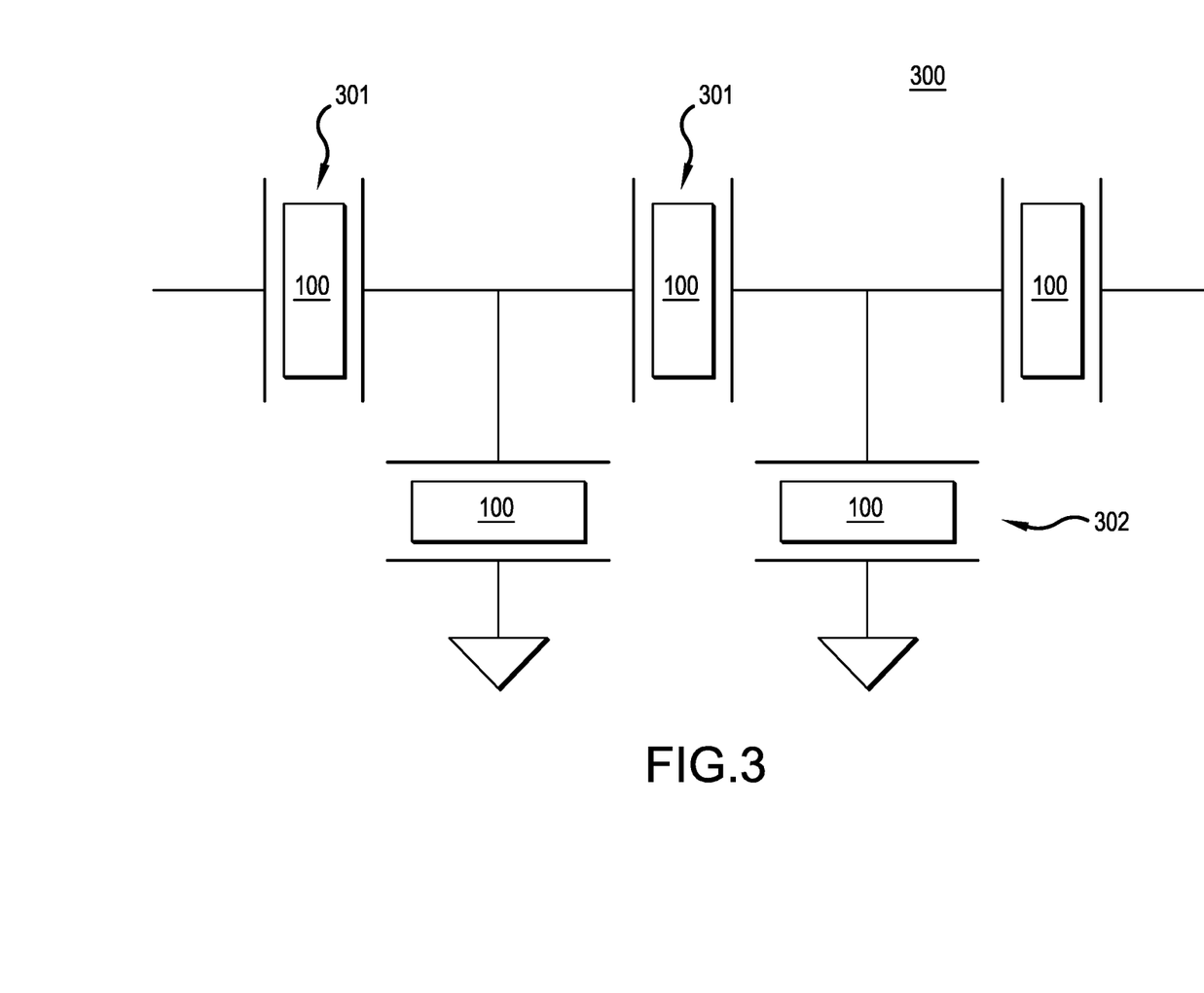
FIG. 3 is a simplified schematic block diagram of a filter comprising a acoustic resonator structures according to a representative embodiment.

As noted above, when connected in a selected topology, a plurality of SAW resonators can function as an electrical filter. FIG. 3 shows a simplified schematic block diagram of an electrical filter 300 in accordance with a representative embodiment. The electrical filter 300 comprises series SAW resonators 301 and shunt SAW resonators 302. The series SAW resonators 301 and shunt SAW resonators 302 may each comprise SAW resonator structures 100, 200 described in connection with the representative embodiments of FIGS. 1A-2. As can be appreciated, the SAW resonator structures (e.g., a plurality of SAW resonator structures 100, 200) that comprise the electrical filter 300 may be provided over a common substrate (e.g., substrate 108), or may be a number of individual SAW resonator structures (e.g., SAW resonator structures 100, 200) disposed over more than one substrate (e.g., more than one substrate 108, 208). The electrical filter 300 is commonly referred to as a ladder filter, and may be used for example in duplexer applications. It is emphasized that the topology of the electrical filter 300 is merely illustrative and other topologies are contemplated. Moreover, the acoustic resonators of the representative embodiments are contemplated in a variety of applications including, but not limited to duplexers.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

We claim:

1. An acoustic resonator structure, comprising:
an acoustic stack, comprising:
a substrate having a first surface and a second surface;
a piezoelectric layer disposed over the substrate, the piezoelectric layer having a first surface, and a second surface, wherein the first surface of the substrate, or the second surface of the piezoelectric layer, comprises a plurality of features;
a plurality of electrodes disposed over the first surface of the piezoelectric layer, the plurality of electrodes configured to generate surface acoustic waves in the piezoelectric layer;
a first temperature compensation layer disposed between the first surface of the substrate and the second surface of the piezoelectric layer; and
a second temperature compensation layer disposed over the plurality of electrodes, wherein a temperature coefficient of frequency (TCF) of the acoustic stack is approximately zero (0.0) over a downlink frequency range between approximately 746 MHz and approximately 756 MHz or an uplink frequency range between approximately 777 MHz and approximately 787 MHz, wherein the second temperature compensation layer comprises silicon dioxide and a thickness of no more than 2000 Å.

2. The acoustic resonator structure of claim 1, wherein the first and second temperature compensation layers each have a positive TCF.

3. The acoustic resonator structure of claim 1, wherein the TCF of the acoustic stack is approximately zero (0.0) over the uplink frequency range between approximately 777 MHz and approximately 787 MHz.

4. The acoustic resonator structure of claim 1, wherein the TCF of the acoustic stack is approximately zero (0.0) over the downlink frequency range between approximately 746 MHz and approximately 756 MHz.

5. The acoustic resonator structure of claim 1, wherein the first temperature compensation layer comprises silicon dioxide.

6. The acoustic resonator structure of claim 5, wherein the silicon dioxide is boron-doped silicon dioxide (borosilicate glass (BSG)).

7. The acoustic resonator structure of claim 6, wherein the BSG has a doping level of approximately 2.0 atomic percent (atm %) to approximately 3.0 atm %.

8. The acoustic resonator structure of claim 6, wherein the BSG has doping level less than approximately 5.0 atomic percent (atm %).

9. The acoustic resonator structure of claim 6, wherein the first temperature compensation layer has a thickness in a range of approximately 0.5 µm to approximately 10.0 µm.

10. The acoustic resonator structure of claim 6, wherein a wavelength ($\lambda$) of a surface acoustic wave is substantially equal to a pitch of the plurality of electrodes, and the first temperature compensation layer has a thickness in a range of approximately 0.25$\lambda$ to approximately 2$\lambda$.

11. The acoustic resonator structure of claim 6, wherein the piezoelectric layer has a thickness of at least approximately 0.5 µm.

12. The acoustic resonator structure as claimed in claim 5, wherein silicon dioxide comprises phosphosilicate glass (PSG).

13. The acoustic resonator structure of claim 5, wherein the second temperature compensation layer has a thickness in a range of approximately 250 Å to approximately 2000 Å.

14. The acoustic resonator structure of claim 5, wherein the first temperature compensation layer has a thickness in a range of approximately 0.5 µm to approximately 10.0 µm.

15. The acoustic resonator structure of claim 5, wherein a wavelength ($\lambda$) of a surface acoustic wave is substantially equal to a pitch of the plurality of electrodes, and the first temperature compensation layer has a thickness in a range of approximately 0.25$\lambda$ to approximately 2$\lambda$.

16. The acoustic resonator structure of claim 5, wherein a wavelength ($\lambda$) of a surface acoustic wave is substantially equal to a pitch of the plurality of electrodes.

17. The acoustic resonator structure of claim 5, wherein the piezoelectric layer has a thickness in a range of approximately 0.5 µm to approximately 50 µm.

18. An acoustic filter comprising a plurality of selectively electrically connected acoustic resonator structures of claim 1.

19. An acoustic resonator structure, comprising:
an acoustic stack, comprising:
a substrate having a first surface and a second surface;
a piezoelectric layer disposed over the substrate, the piezoelectric layer having a first surface, and a second surface, wherein the first surface of the substrate, or the second surface of the piezoelectric layer, comprises a plurality of features;
a plurality of electrodes disposed over the first surface of the piezoelectric layer, the plurality of electrodes configured to generate surface acoustic waves in the piezoelectric layer;
a first temperature compensation layer disposed between the first surface of the substrate and the second surface of the piezoelectric layer; and
a second temperature compensation layer disposed over the plurality of electrodes, wherein at least one of the first temperature compensation layer and the second temperature compensation layer comprise phosphosilicate glass (PSG), wherein a temperature coefficient of frequency (TCF) of the acoustic stack is approximately zero over a predefined downlink frequency range or a predefined uplink frequency range.

20. The acoustic resonator structure of claim 19, wherein both the first temperature compensation layer and the second temperature compensation layer comprise phosphosilicate glass (PSG).

* * * * *